United States Patent [19]

Bonyhard et al.

[11] 4,007,453
[45] Feb. 8, 1977

[54] MAGNETIC BUBBLE MEMORY ORGANIZATION

[75] Inventors: Peter Istvan Bonyhard, Edison; Yu-Ssu Chen, New Providence; James Lanson Smith, Bedminster, all of N.J.

[73] Assignee: Bell Telephone Laboratories, Incorporated, Murray Hill, N.J.

[22] Filed: Mar. 31, 1975

[21] Appl. No.: 563,664

[52] U.S. Cl. .................................... 340/174 TF
[51] Int. Cl.² .................................... G11C 11/14
[58] Field of Search ............... 340/174 TF, 174 SR

[56] References Cited
UNITED STATES PATENTS

| | | | |
|---|---|---|---|
| 3,713,116 | 1/1973 | Bonyhard et al. | 340/174 TF |
| 3,714,639 | 1/1973 | Kish et al. | 340/174 TF |
| 3,732,551 | 5/1973 | Homma et al. | 340/174 TF |
| 3,797,001 | 3/1974 | Chen et al. | 340/174 TF |
| 3,810,133 | 5/1974 | Bobeck et al. | 340/174 TF |
| 3,838,407 | 9/1974 | Juliussen | 340/174 TF |
| 3,944,991 | 3/1976 | Murakami | 340/174 TF |

Primary Examiner—James W. Moffitt
Attorney, Agent, or Firm—Herbert M. Shapiro

[57] ABSTRACT

A magnetic bubble memory operative in the field-access mode is organized with separate read and write major channels accessing the same plurality of minor loops. The permalloy elements characteristic of field-access bubble memories define a novel swap function at each position at which data is moved between a stage of the write major channel and the associated minor loop. Improved data rates are achieved.

18 Claims, 12 Drawing Figures

MAGNETIC BUBBLE MEMORY ORGANIZATION

FIELD OF THE INVENTION

This invention relates to magnetic memories, and more particularly to such memories in which data is represented by patterns of single wall magnetic domains such as magnetic bubbles.

BACKGROUND OF THE INVENTION

Magnetic bubble memories are now well known in the art. One mode of operation of such memories is termed the "field-access" mode because bubble movement in a film of bubble material is responsive to a magnetic drive field rotating in the plane of the film. Typically, the film comprises an epitaxial film of garnet although the use of amorphous films is contemplated. The bubble pattern, and thus stored bits of data represented by that pattern, move in the film along paths defined by a periodic pattern of magnetically soft (high permeability) elements, typically permalloy. The elements produce magnetic pole patterns that change as the drive field reorients to produce the localized field gradients for effecting bubble movement in the film.

The field-access, bubble memory is usually arranged in a "major-minor" organization disclosed in U.S. Pat. No. 3,618,054 of P. I. Bonyhard, U. F. Gianola, and A. J. Perneski issued Nov. 2, 1971. In that type of organization, the pattern of permalloy propagate elements defines a plurality of permanent storage loops, termed "minor" loops, in which bubble patterns are recirculated as the drive field reorients. Access to and from the minor loops is provided by means of an accessing channel or loop termed the "major" channel or loop also defined by permalloy elements. Bits are moved to and from the major loop at data exchange positions where the major and minor loops come into close proximity. In prior art bubble memories, the permalloy pattern defining the exchange positions operates, for example, to transfer or replicate data.

The major loop or channel of a bubble memory organized in the major-minor manner includes a data write and a data read position. If a major loop is employed, data is transferred to the accessing loop at the exchange positions leaving a vacancy in each minor loop. If the numbers of stages in the major and minor loops are chosen properly, data can be read out and (that data or updated data) returned to exchange positions in time to be transferred back into those vacancies during a single recirculation of the data about the loop. If a major channel is employed, an image of the stored data is replicated into the major channel for eventual annihilation after read out. There is in this latter case, of course, no necessity to return the data to the originating address, a procedure requiring a sufficient time for a complete recirculation of data about the minor loop. Thus, consecutive read operations can occur without the necessity of delay for data return in the latter organization. On the other hand, if a write operation is required, data annihilation is required along with a complete recirculation of the resulting vacancies, before the write operation is completed, in the latter organization also.

A figure of merit for the operation of various organizations for bubble memories is the "write cycle time" (or "read-rewrite" cycle time) which is the number of cycles of the drive field which occurs between consecutive write (or between read and subsequent rewrite) operations. For a major-minor organization having a single major channel for accessing, the average write cycle time is $m/2 + m = 1.5m$ where $m =$ the number of stages in a minor loop. It is typical in these types of memories that the number of minor loops is about equal to one-fourth the number of stages in a minor loop. The $1.5m$ figure occurs because in each instance, an address is selected and advanced to exchange positions ($m/2$ cycles on the average), and new data is advanced for transfer to the selected address when that address next appears at the exchange positions ($m$ cycles).

An organization which exhibits improved write cycle time is one in which write and read operations are not performed in a single accessing channel but in separate accessing channels conveniently at opposite ends of the minor loops. In such double major channel bubble memories, on the average, $m/2$ cycles of the drive field are required to move an address to the exchange positions at the read accessing channel, and $m/2$ cycles are subsequently required to move the address to the exchange positions at the write channel, a total of $m$ cycles in all.

It is a common operation in information systems to update data stored in a selected address. Frequently, the operation necessitates the comparison of stored data with tag bits to ascertain whether or not update is appropriate. The decision to update, in many systems, is delayed until read out occurs. That is to say, in many systems a decision to update data in a selected address is delayed until after the data stored in that address is read out. Particularly, in systems in which update decisions are delayed, a penalty is paid in write cycle time. In accordance with the present invention, no penalty need be paid in such systems.

BRIEF DESCRIPTION OF THE INVENTION

A double major channel bubble memory is herein organized to include a novel "swap" function at exchange positions where minor loops and associated stages of a write major channel come into close proximity. Data written into the write channel is exchanged for data at an address location essentially during a single cycle of the in-plane field. Consequently, no delay, after a decision to update, need occur due to recirculation of data in the minor loops. Rather, an update decision, made after reading data via a read major channel in a double channel organization, requires an overall delay between read and update of only that time required to move data from the read to the write exchange positions.

A swap function is defined at exchange positions by permalloy propagate elements cooperative with an electrical conductor and is operative to exchange newly written data for previously stored data without the necessity of first clearing the write channel of data. The arrangement of permalloy elements causes bidirectional movement of data between a stage of a write channel and a stage of the associated minor loop at the exchange position therebetween. To be more specific, the permalloy elements at each exchange position define two separate paths for movement of bubble patterns, in first and second directions during a given cycle of the drive field. In practice, a conductor arrangement is pulsed to divert the bubbles into the two paths during consecutive first and second half cycles of the drive field.

In one specific embodiment of this invention, 128 minor loops are associated with alternate stages of a write channel and are defined by asymmetric half disc permalloy elements disclosed in copending application Ser. No. 541,884 of P. I. Bonyhard, Y. Chen, and J. L. Smith filed Jan. 17, 1975 and now abandoned. Each minor loop is 513 stages long providing a memory capacity of nominally 64,000 (64K) bits. A read major channel, similarly defined, is closely spaced from the opposite end of the minor loops.

For a double-channel organization including swap functions defined at exchange positions between the minor loops and a write accessing channel in accordance with this invention, only $m/2$ cycles of the drive field need occur between a read operation and an associated update operation.

The following table summarizes the performance of the various organizations. The symbols "N" and "Y" indicate "no" and "yes" to the presence of the element designated in the column heading as an element in a system defined in a given row.

| Separate Write and Read Major Channels | Swap Function Used | Delayed Write Decision Available | Write Cycle (av. No. of Steps) | Read-Write Cycle (av. No. of Steps) |
|---|---|---|---|---|
| N | N or Y | N | 768 | 768 (1.5m) |
| N | N | Y | — | 1280 (2.5m) |
| N | Y | Y | — | 1024 (2.0m) |
| Y | N or Y | N | 512 | 512 (m) |
| Y | Y | N or Y | 512 | 512 (m) |
| Y | N | Y | — | 1024 (2m) |

The top row of the table thus indicates a system which does not have separate write and read major channels and does not have a delayed write decision. The write cycle time for such a (nominally 64K) system is 768 cycles as is the read rewrite cycle time. This number holds whether or not a swap function is present.

A comparison of the bottom two rows of the table indicates that for systems having separate write and read major channels, the presence of a swap function ensures a write cycle time equal to the read-rewrite cycle time of 512 cycles, whereas the absence of the swap function necessitates a read-rewrite cycle time of 1024 cycles.

The pattern of propagate elements which defines a swap function between two channels of a field-access bubble memory is considered an important feature of this invention.

Another feature of this invention is a major-minor bubble memory with separate write and read accessing channels with swap functions defined at exchange positions between the write channel and the minor loops therein.

Still another feature of this invention is a major-minor organized bubble memory with a plurality of swap functions defined between minor loops and the write accessing channel and organized electrically in series for synchronous operation.

DETAILED DESCRIPTION

Double Accessing Channel Organization

Minor Loops

Figure 1:
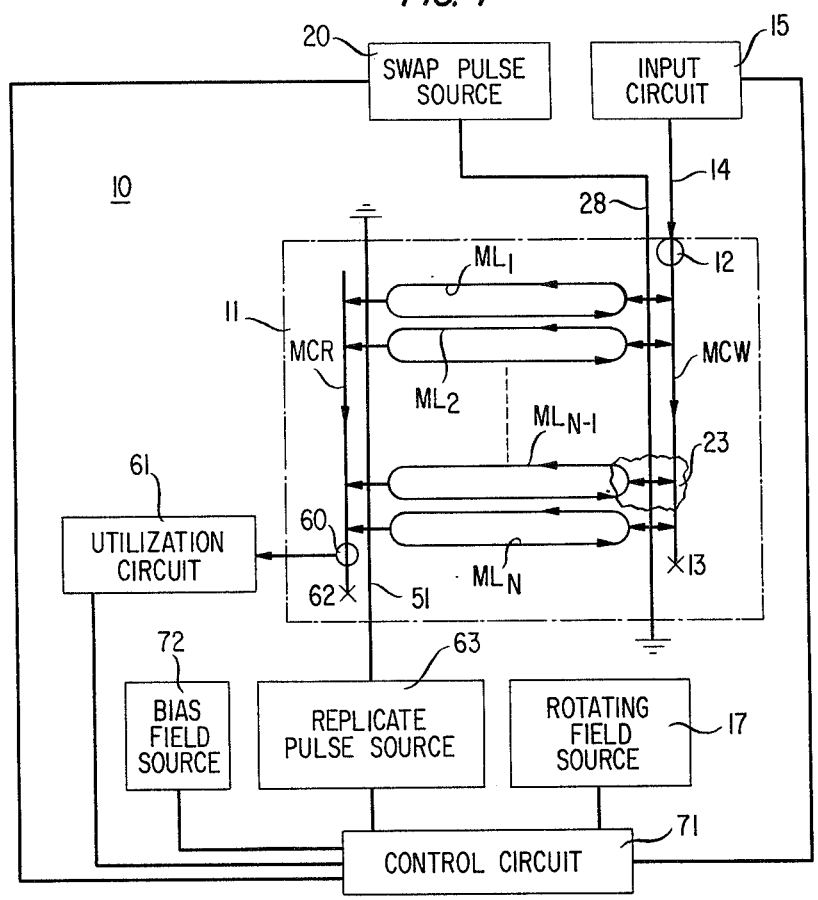
FIG. 1 is a schematic illustration of a double major-channel bubble memory with separate write and read accessing channels.

FIG. 1 shows an embodiment 10 of this invention. The embodiment comprises a layer 11 of material in which single wall domains or bubbles can be moved. Movement of domains takes place along paths defined by permalloy propagate elements and is illustrated in the figure schematically by lines including arrows to indicate directions of bubble movement. Specifically, the propagate elements define closed paths or loops $ML_1 \ldots ML_N$ in which bubbles move counterclockwise as will be understood more fully hereinafter. These paths constitute the minor loops of the memory and function as a permanent store.

Write Accessing Channel

The right ends of the minor loops, as viewed in FIG. 1, come into close proximity to a write major channel MCW. Channel MCW extends from a write position 12 to an annihilate position 13 and is defined by propagate elements operative to move a bubble from position 12 to position 13 as data is moved counterclockwise in the minor loops.

A write position is defined by permalloy elements operative in conjunction with an electrical conductor. The conductor is pulsed to nucleate a bubble at the position for further movement along channel MCW. Nucleate bubble generators are well known in the art as shown in U.S. Pat. No. 3,789,375 of Y. Chen, J. E. Geusic, T. J. Nelson, and H. M. Shapiro, issued Jan. 29, 1974. Arrow 14 of FIG. 1 represents a conductor for such a nucleate generator. A suitable input circuit for pulsing the conductor is represented by block 15.

A bubble nucleated by a pulse in conductor 14 moves downward along channel MCW in response to a magnetic drive field rotating in the plane of layer 11 in the usual field-access mode. The presence or absence of a pulse in conductor 14 during each of consecutive cycles of the drive field establishes a pattern of bubbles in channel MCW for movement to the minor loops. For the assumed illustrative arrangement, conductor 14 is pulsed (or not) in each of alternative cycles of the drive field to establish a bubble pattern consistent with the spacing of the minor loops in positions corresponding to alternate stages of channel MCW.

A source of a reorienting (i.e. rotating) drive field is represented by block 17 in FIG. 1.

Figure 2:
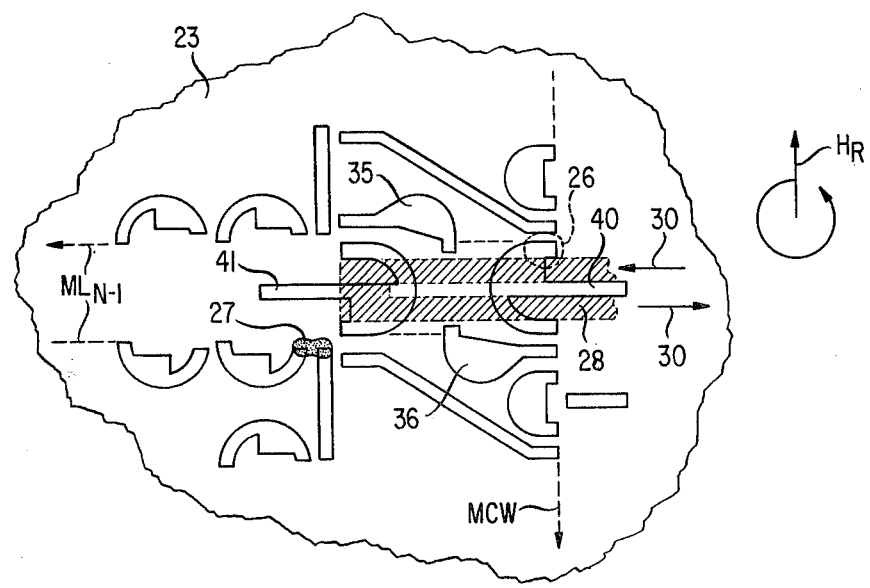
FIGS. 2–9 are schematic illustrations of portions of the permalloy pattern defining the various channels and loops along with exchange positions therebetween in the memory of FIG. 1.

Data bits moving along write channel MCW are moved in parallel into minor loops for permanent storage. That movement occurs at information exchange positions defined where channel MCW comes into close proximity with associated stages of the minor loops. Data stored in the minor loops $ML_1$ to $ML_N$ is recirculated counterclockwise as shown in FIG. 2 synchronously with this movement of data in channel MCW in response to the drive field. As the data recirculates, consecutive bits in each minor loop pass the associated exchange position with channel MCW where exchange of data occurs. A write operation requires an exchange of data between the minor loops and channel MCW.

Whether a swap, transfer or replicate operation takes place at the exchange positions, a pulsed conductor controls the operation to move a bubble pattern (i.e., bubble or no bubble) between a minor loop and the associated stage of channel MCW. In the case of a transfer, a vacancy is left in the minor loop as mentioned hereinbefore. In case of replication, a duplicate or image of the stored data is moved, for example, to channel MCW for ultimate annihilation. If a swap function is employed, data is transferred from the minor loops to channel MCW at the same time newly written data is moved synchronously into the vacancies created by that transfer. Since the preferred embodiment of this invention employs the swap function in each exchange position between the write channel and the minor loops, the operation of the swap function and its use are now described as a context for a description of the operation of the illustrative embodiment herein.

The Swap Function

Figure 3:
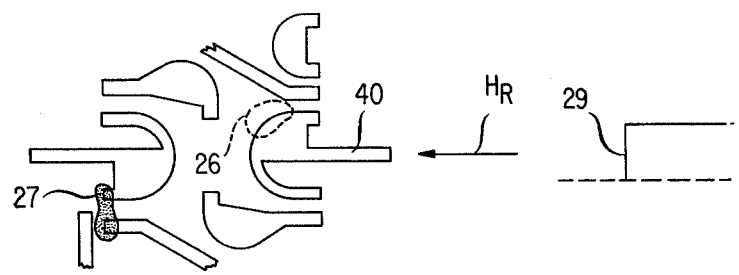

FIG. 2 shows the electrical conductor and propagate element pattern organization for a representative swap position 23 of FIG. 1. The swap of a "no-bubble" (a binary zero), represented by a broken closed curve 26 in FIG. 2, for a bubble, represented by a closed curve 27 in channel MCW and loop $ML_{N-1}$, respectively, is illustrated in the following figures. Operation commences with the drive field directed upward as indicated by arrow $H_R$ in the figure. Conductor 28, occupying a plane illustratively between that of the permalloy pattern and layer 11, is pulsed, as indicated by pulse 29 just before the drive field next reorients to the left as shown in FIG. 3. The polarity of the current is indicated by arrows 30 in FIG. 2. FIG. 3 shows the drive field directed to the left as viewed in the figure and indicated there by arrow $H_R$. No-bubble 26 and bubble 27 (data bits), in response, move to the positions shown in FIG. 3. Meanwhile pulse 29 remains on.

Figure 4:
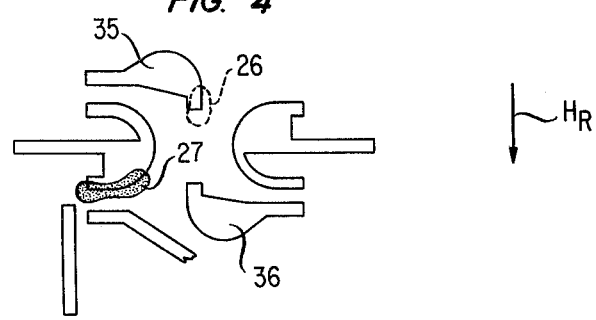
Figure 5:
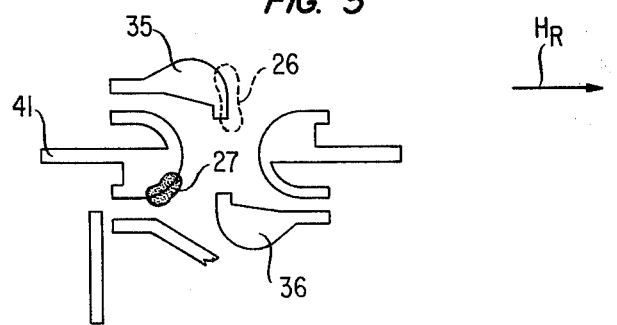

In FIG. 4, the drive field is shown rotated to a downward orientation as indicated by arrow $H_R$ in the figure. The bits represented by indication 26 and 27 move in response to the position shown in the figure. As the field rotates to the right as indicated by arrow $H_R$ in FIG. 5, the bits merely change geometry staying substantially unmoved. Some liberties in the description are taken with respect to the no-bubble indication 26. Since a bubble is absent (representing a binary zero), no change in geometry actually occurs. The changes in geometry shown actually correspond to the shape a bubble would take if present. The indication is broken to represent a no-bubble condition.

Figure 6:
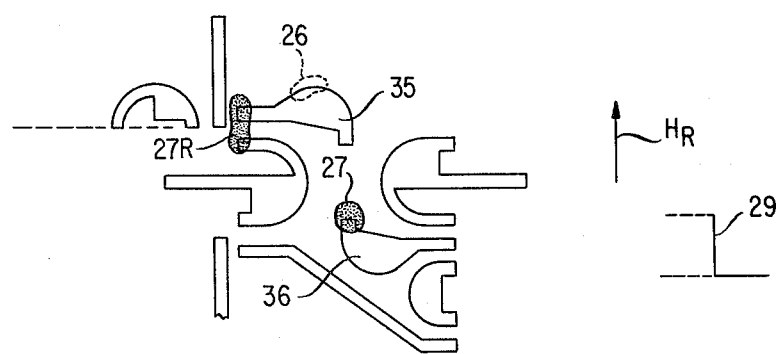

The drive field next rotates to an upward orientation indicated by arrow $H_R$ in FIG. 6. Bit 26 can be seen to move upward and to the left along the top edge of element 35 to which it was transferred as shown in FIG. 4. In FIG. 6, the similar transfer of bit 27 to element 36 is shown. The current in conductor 28 is now terminated as indicated by the pulse form 29 in FIG. 6.

A comparison of the arrow $H_R$ orientations in FIGS. 2 and 6 indicate that one cycle of the in-plane field is completed during the swap operation. It is to be noted that the current (29) is on for this entire period in the illustrative embodiment. It will be seen, however, that this current duration is not entirely necessary.

Figure 7:
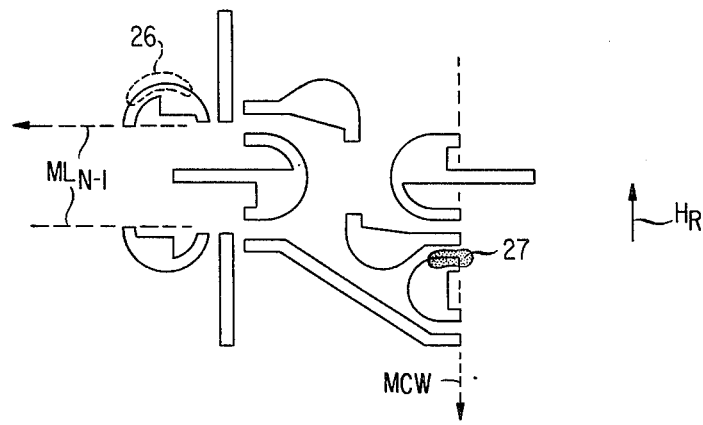

As the drive field rotates to the left and then downward, bubble 27 moves to the right along the lower edge of element 36. When the drive field is next directed upward as indicated in FIG. 7, bit 26 can be seen to occupy a position in minor loop $ML_{N-1}$ and bit 27 occupies a position in major channel MCW. Thus, an additional cycle of the drive field moves the swapped data into correct positions in their transferred paths.

The illustrative swap function is realized because of the blocking action of the current in conductor 28 of FIG. 2. The current causes an attractive magnetic field directed downward away from the viewer along the outer edge of the conductor indication as indicated by the minus signs in FIG. 2. As long as the current flows in conductor 28, bit 26 cannot move (downward) along the left side of element 40 as viewed in FIG. 3. Consequently, during the first half cycle of the in-plane field during a swap operation, bit 26 transfers to element 35 as shown in FIG. 4. Similarly, the field generated by the current flow in conductor 28 prevents bit 27 from moving (upward) along the right edge of element 41 in FIG. 5. During the second half cycle of the in-plane field during the swap operation, transfer of bit 27 to element 36 occurs instead.

The polarity designations for the currents and fields herein are based on the premise that a bubble with its magnetization directed toward the viewer exhibits a north pole (+) at its top surface. Accordingly, a negative magnetic field (−) is designated herein as an attractive field for that bubble. To be consistent with these polarities, the arrows $H_R$ in the figures which represent the drive field direction are defined as pointing towards a south pole.

It is helpful to recognize that as long as bits are moving in two different directions from elements 40 and 41, the permalloy elements of the exchange positions must be designed so that the bits move in two distinct paths during different half cycles of the drive field. During each half cycle, one bit is being blocked from the next natural position in its originating path and redirected to a transferee position whereas the other bit, with which the swap is to occur, is unaffected by the blocking pulse. It should be clear also that for a conductor aligned along the axis of the path of exchange as shown in FIG. 2, either a single one or two separate pulses (starting approximately at the times shown in FIGS. 2 and 4) can be used to effect the swap.

A swap function, of course, necessitates the presence of data in the major (write) channel as well as in the minor loops when the swap occurs. In contradistinction, all prior art major-minor organized bubble memories require the major channel or loop to be unoccupied when data is transferred to the major channel or loop.

Figure 8:
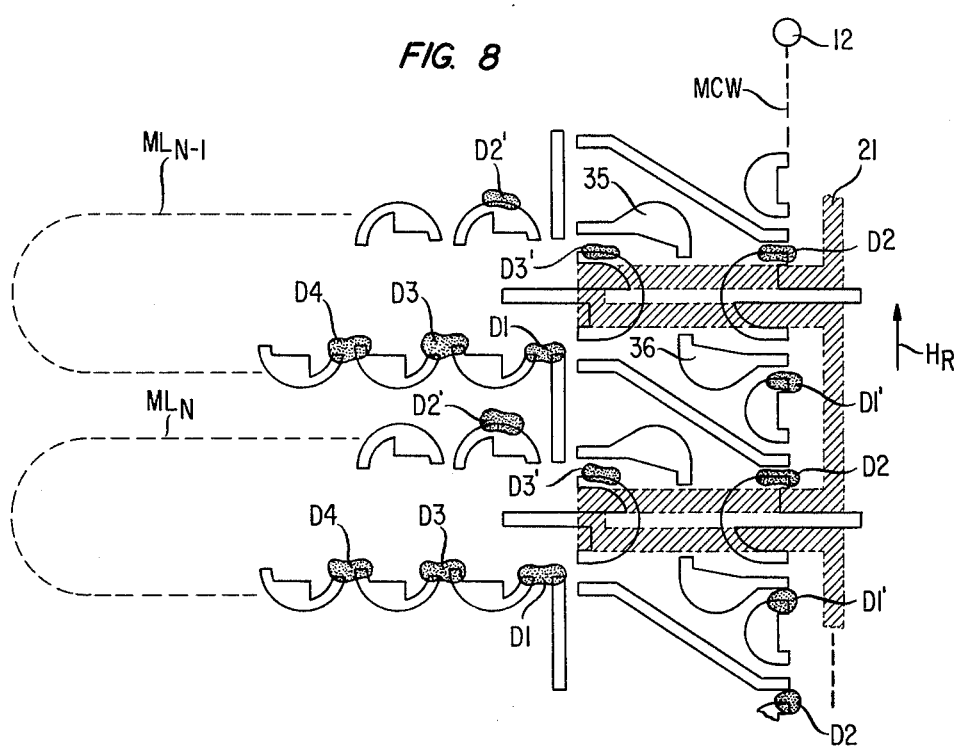

FIG. 8 shows the permalloy and conductor patterns for exchange positions of adjacent minor loops $ML_{N-1}$ and $ML_N$ for the purpose of demonstrating that the write major channel can be occupied by a bubble pattern when a swap occurs without the loss of data. It is helpful to note that adjacent bits (D2 of FIG. 8) in channel MCW occupy alternate bit positions in the illustrative embodiment. The figure shows a pattern of asymmetric disc-shaped elements of a geometry to move data counterclockwise about representative loops $ML_N$ and $ML_{N-1}$. Closed curves D1 in the figure represent bits of data in the minor loops, conveniently taken to be bubbles, entering the exchange positions from the minor loops as shown. Data is moving downwards in channel MCW synchronously.

At this juncture in the operation, conductor 21, coupling the exchange positions electrically in series, is pulsed. The timing of the pulse is such that it is initiated when the drive field (already) is directed, as indicated by arrow $H_R$ in FIG. 8, and is operative first to move bits D2 to positions indicated by D2' and then to move bubbles D1 to positions indicated by D1' during the following two cycles. The pulse occurs during only the first full cycle of this period. As is apparent from the figure, a swap operation occurs without loss of information in a series of exchange positions in response to a pulse applied to a conductor serially coupling those positions. Next subsequent bits in each minor loops are represented by closed curves D3 and D4. Closed curve D3' represents the ultimate position for bit D3 for the period, including the swapping operation, during which bit D1 moves to D1'.

The only time that write channel MCW is used, in the illustrative embodiment is when newly written data is to be swapped as described. The old information (D1') moves downward in channel MCW to annihilator 13 of FIG. 1 which, in practice, comprises a familiar dynamic guard rail operative to remove bubbles from the active circuit. The guard rail comprises chevron, T-shaped, or asymmetric disc-shaped elements oriented to move bubbles outwardly from the active circuit encompassed by the guard rail in accordance with the principles disclosed in A. H. Bobeck U.S. Pat. No. 3,729,726 issued Apr. 24, 1973.

Successive write operations can occur in a manner to fill the write channel with successive groups of bits for storage at successively selected addresses in the minor loops. But the operations must take into account intervening read operations.

Read Accessing Channel

All read operations are carried out from the opposite ends of the minor loops by movement of information from a selected address in the minor loops into a second major (read) channel designated MCR in FIG. 1. Data is moved to channel MCR by replication, in the illustrative embodiment. Suitable bubble replicators are shown in U.S. Pat. No. 3,832,701 of A. H. Bobeck and T. J. Nelson, issued Aug. 27, 1974 and in U.S. Pat. No. 3,810,133 of A. H. Bobeck and I. Danylchuk issued May 7, 1974. The first of these patents actually shows a blocking-mode transfer function. But a change in the timing of the transfer pulse with respect to the phase of the drive field produces a replication rather than a transfer of the data in a manner analogous to that discussed hereinbefore. Alternatively, a pattern of elements operative to perform swap functions may be employed in exchange positions at the read channel. When such a pattern is employed to perform replicate functions, the channel in which the image is to appear is free of bits and pulse 29 of FIGS. 3 and 6 is applied when bit 26 is located at the left end of element 40 as shown in FIG. 3. That is to say, pulse 29 in this instance is applied just after the drive field rotates to the left as viewed in FIG. 3. Actually, the "swap function" pattern of elements can be used as a bidirectional replicator for a bit at the left or right ends of elements 40 or 41, respectively, as viewed in FIG. 2 when a pulse (29) is so applied.

Figure 9:
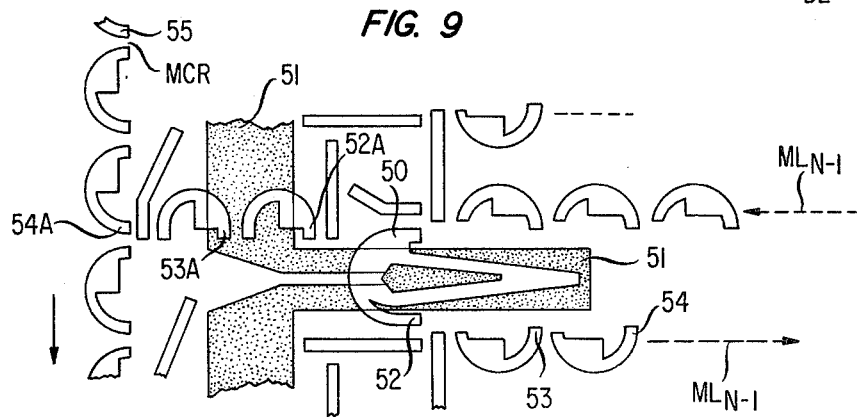

FIG. 9 shows the pattern of overlay elements for a representative exchange position of a minor loop $ML_{N-1}$ where that loop comes into close proximity with read major channel MCR. The figure shows asymmetric disc elements along with an elongated element 50 for defining the loop turn. Element 50 can be seen to have a divided base portion extending to the right along the axis of loop $ML_{N-1}$ as viewed in the figure, and an asymmetry to its top portion. An electrical conductor 51 is associated with element 50 and is operative to cut into two a bubble at a position at the left end of element 50, as viewed in the figure, when pulsed. Replicators operative in this manner are disclosed, for example, in the above-mentioned A. H. Bobeck et al., U.S. Pat. No. 3,810,133. The two resulting bubbles move to the succession of positions 52, 53, 54 and 52A, 53A, and 54A to loop $ML_{N-1}$ and to channel MCR, respectively.

Conductor 51 couples an element 50 in each of loops $ML_1$ to $ML_{N-1}$ electrically in series. Thus, when conductor 51 is pulsed, replication occurs for each bit occupying an analogous position in each one of those loops. A bit from a next adjacent loop, for example, yields a bit in position 55 in FIG. 9. Of course, the bit may be a binary zero (no bubble) or a binary one (a bubble).

The movement of the original bubble pattern through similar successions of positions as described occurs in response to continued drive field reorientation by rotation counterclockwise as viewed in FIG. 9. The data image, reproduced by replication in response to the pulse in conductor 51, moves downward in channel MCR to a detector 60 of FIG. 1. Detector 60 applies a signal to a utilization circuit represented by block 61 of FIG. 1 in response to each bit of the advancing bubble pattern. The bubbles pass to an annihilator represented by an X sign designated 62 in FIG. 1 after detection. The annihilator typically comprises a guard rail into which an expansion detector (60) is conveniently integrated as disclosed in A. H. Bobeck U.S. Pat. No. 3,810,132 issued May 7, 1974.

Block 63 of FIG. 1 represents a replicate pulse source for applying a pulse to conductor 51 of FIG. 9 for producing the image of the data in the selected address of the minor loops. Selection of an address for readout is determined by the drive field cycle count since each successive cycle moves a successive pattern of bits into the replicate positions.

Recapitulation — Double Accessing Channel Organization

To recapitulate, we have now established that a double major channel bubble memory herein is operative to swap new data for data previously stored in a selected address in minor loops which recirculate the stored data. The swap is seen to occur at exchange positions defined by permalloy elements in areas where a write major channel and the minor loops come into close proximity. The swap operation is controlled by a conductor which is pulsed at the proper drive field cycle count which designates the selected address. Previously stored data is advanced, if desired, to an annihilation port in the write channel.

Simultaneously, data is read out at the opposite ends of the minor loops where replication functions are defined at exchange positions where a read major channel and the minor loops come into close proximity. The replication operation also is controlled by a conductor pulsed at the proper cycle count for designating a selected address. Addressing is controlled by a control circuit represented by block 71 of FIG. 1.

The relationship between the read and write operation is now discussed in the context of a practical memory arrangement.

Practical Memory Organization

It may be helpful to understand that in a practical memory, a plurality of memory planes are employed and FIG. 1 represents a single bit plane of such a multiplane memory. Accordingly, each bit in each minor loop as shown in the figures, has a counterpart in each of a plurality of planes, not shown, and can be taken to apply to the detectors of the multiplane arrangement a word of data comprising the like-positioned bits in the several planes. The movement of the data in (one plane) layer 11 of FIG. 1 thus can be taken as representative (of movement in all the planes) and the advance of the data of a particular address in layer 11 thus represents what is in practice the advance of an entire block (of binary words) to, for example, read accessing channels of which MCR is representative. In this context, the movement of data in successive read and write operations is discussed in connection with FIGS. 10 and 11 and will be seen to enable consecutive blocks of information to occupy consecutive available positions in the accessing channels so long as consecutive addresses are properly distributed in memory. This feature of the memory enables the writing and reading of varying block lengths up to the full capacity of the memory.

Data Movement in Memory

Figure 10:
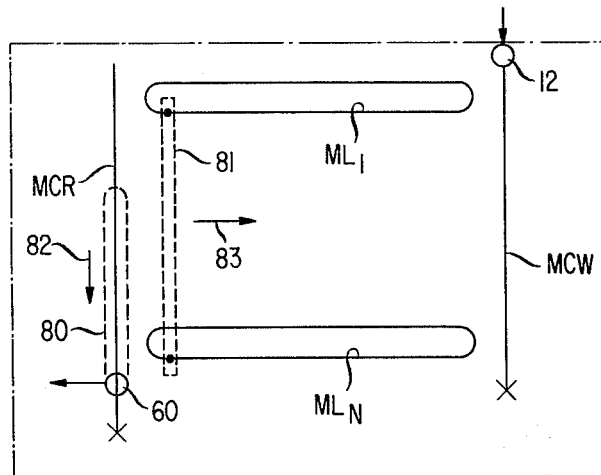
FIGS. 10 and 11 are schematic illustrations of the memory of FIG. 1 showing the movement of data therein during operation.
Figure 11:
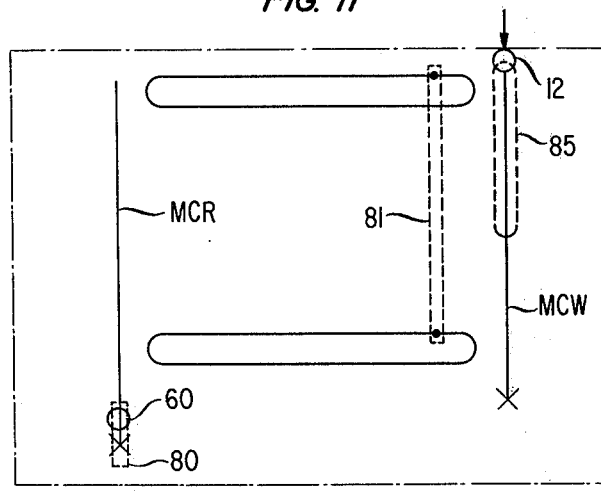

FIGS. 10 and 11 show line diagrams of the various bubble channels defined in layer 11 of FIG. 1. During a read operation, a "block" of bits (an image) is moved from the left ends of loops represented by $ML_1$ to $ML_N$ into channels (MCR) as stated hereinbefore. A detector 60 (in each plane) is positioned close to loop $ML_N$ (approximately 60 stages away) to permit data read out to occur quickly once the memory is addressed. When the first bit of an addressed block reaches the detectors, the block is disposed in channels MCR as indicated by broken closed curve designated 80 in the figure. The (still) stored data is in the position represented by broken closed curve 81 in the figure. The blocks are moving as indicated by arrows 82 and 83, respectively.

As the drive field reorients, the last bit of the block of data represented by broken closed curve 80 reaches detectors 60 (in 512/2 + 60 steps for minor loop showing 512 or 513 stages) as indicated in FIG. 11. At this time, the data represented by closed curve 81 has already passed a position to the right end of loops $ML_1-ML_N$ and is in a position as shown by broken block 81 in FIG. 11. The search for a new address may commence (60 steps) prior to this juncture, actually in 512/2 steps after replication, because channel MCR is free of data at that time and data in a new address may be imaged into that channel without loss of information. Consequently, channel MCR may include successive blocks of information spaced apart a number of stages equal to the number of cycles necessary to move data in a next consecutive address to the read exchange positions—a separation completely eliminated by a proper choice in the selection of addresses for the storage of data in memory. For example, in a nominally 64K bit memory (per plane) 128 minor loops are associated with alternative stages of the write or read accessing channel and each minor loop has 513 stages.

The block of bits (words) represented at 80 in FIG. 10 is moved clear of the exchange positions to minor loops in 256 cycles of the drive field. If a next consecutive address is at the read exchange positions at this juncture in the operation, that data at that address can be read out thus providing continuous data read. When the drive field completes another 256 cycles, a third block can be read out, and so forth. The provision for continuous read out thus merely necessitates that adjacent addresses arbitratily designated $A_1$, $A_2$, $A_3$ . . . $A_{m-1}$, $A_n$, be physically located in memory to arrive at read exchange position 256 cycles apart. The arrangement of write and read operations to ensure such a distribution of data is achieved with a straightforward algorithm and is well understood in the art.

The provision for consecutive read out in this manner is entirely consistent with continuous write operations. Consider, for example, that each minor loop has a number of stages equal to twice the number of cycles between adjacent bits (plus or minus one). Because of this relationship between the numbers of stages in the various bubble paths, the data of address $A_1$ is advanced to the write exchange positions at the same time the data in address $A_2$ is advanced to the read exchange positions. In other words, blocks 80 and 81 shown in FIGS. 10 and 11 are 256 cycles apart and are representative of consecutive addresses ($A_1$ and $A_2$) at read and write exchange positions. Accordingly, consecutive blocks of data can be entered at write position 12 in FIG. 10, can fill all available positions in channel MCW and can be swapped for stored data at write exchange positions at the same time stored information can be imaged in continuous fashion in channel MCR and read out at 60.

Advantages

A memory organized such that both continuous write and read operations occur when data is distributed as described is insensitive to data block length. This characteristic has great significance in, for example, Electronic Switching Systems where memory has multiple uses. A memory in such a system, for example, may be called on to supply a block of translation data to route a telephone call from Somerville, N.J., to Boston, Mass. This may require a small block of about 10 words. On the other hand, the memory also is used as a back up to a central office mainframe and may be called on to dump all data continuously into the mainframe, 64K blocks without separation into 128 word blocks.

In similar fashion, variable-block capability is particularly advantageous in teletypewriter systems. If this capability were not available, the memory in such a system would have to be equipped to stop receiving when it completed the storage of a 128-word block of data. With the variable block length capability, the memory need not even know whether an incoming block is ended or not.

A variable block length capability also lends itself to a simple implementation for achieving a high degree of reliability also. For example, if we continuously write and read, what is written appears at the detector (60 of FIG. 11) 1,026 cycles later. If we provide a delay equal to 1,026 cycles and apply the input data to the delay, the outputs of the delay and the detector can be compared to ensure the correct storage of the input data.

For memory organization where a delayed update decision is desired, it should be clear that the swap function is necessary not only for improved read-write cycle time as described, but also in achieving the variable block length capability.

Magnetic bubbles typically are maintained at a nominal operating diameter by a magnetic field antiparallel to the magnetization of the bubble and provided uniformly in the plane of layer 11 of the figure. Block 22 represents a source of such a field.

Sources 20, 63 and 72 and circuits 15, 17, and 61 operate under the control of control circuit 71. The various sources and circuits may be any such elements capable of operating in accordance with this invention.

Alternative Swap Function Design

Figure 12:
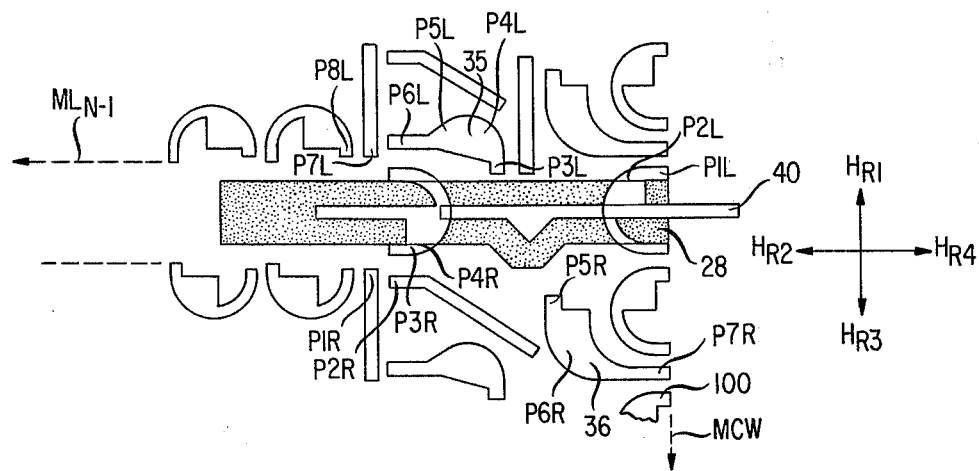
FIG. 12 is a schematic illustration of an alternative exchange position design for a memory of the type shown in FIG. 1.

The swap function as described hereinbefore is operative with data bits stored in alternative positions in the write accessing channel. Alternative designs for exchange positions permit a swap of data bits with data occupying consecutive positions (adjacent stages) in the write accessing channel. FIG. 12 shows one such design. The elements in the figure are designated as are like elements of FIGS. 2 and 8 for ease of comparison. FIG. 12 shows an exchange position between channel MCW and minor loop $ML_{N-1}$. The prime difference in this design of the exchange position when compared to that of FIG. 2 is in the position of element 36 and the related bar-shaped elements; the operation is entirely analogous. In one cycle of the drive field a bit moves from left to right through the sequence of positions P1R, P2R, P3R and P4R. Simultaneously, a bit moves from right to left through the sequence of positions P1L, P2L, P3L, and P4L for the field orientations $H_{R1}$, $H_{R2}$, $H_{R3}$, and $H_{R4}$. In the next cycle, the bits move through the positions P5R, P6R, P7R, and P8R and through positions P5L, P6L, P7L, and P8L, respectively.

Element 100 in FIG. 12 corresponds to element 40 of FIG. 2 but for the next exchange position (i.e., at loop $ML_N$). Accordingly, it can be seen that minor loops are spaced in alternate stages of the write accessing channel in this embodiment. In operation, a bit from the minor loop ends up in exactly that position to which an unswapped bit in the accessing channel would occupy.

What has been described is considered merely illustrative of the principles of this invention. Therefore, various modifications can be devised by those skilled in the art in accordance with those principles within the spirit and scope of this invention as encompassed by the following claims.

What is claimed is:

1. A magnetic arrangement comprising a layer of material in which single wall domains representative of data can be moved, a pattern of elements responsive to a magnetic field reorienting cyclically through at least first and second consecutive half cycles in the plane of said layer for moving said domains, said pattern defining a first pair of associated first and second channels and a first exchange position therebetween, said exchange position including ones of said elements in each of said associated channels, said ones of said elements in each of said channels being operative in response to said field for moving a domain from a first position to a second position in said channel, and a conductor arrangement operative when pulsed to move data from said first positions in said first and second channels to said second positions in said second and first channels, respectively.

2. A magnetic arrangement in accordance with claim 1 wherein said pattern of elements also defines at least a second pair of associated first and second channels and a second exchange position therebetween and said conductor arrangement also couples said layer at said second exchange position electrically in series with said first exchange position for achieving parallel swap of information between said associated first and second channels.

3. A magnetic arrangement in accordance with claim 2 wherein said second channels are recirculating loops and said first channels are defined by said pattern of elements as a multistage first channel having first and second stages therein associated with said first and second exchange positions and including means for entering information into said first channel.

4. A magnetic arrangement in accordance with claim 2 wherein each of said second channels includes first and second spaced apart stages wherein said first stages are associated with stages of said first multistage channel, said arrangement also including a multistage read channel associated with said second stages and means for transferring data from said second stages to said read channel.

5. A magnetic arrangement in accordance with claim 3 wherein said pattern includes asymmetric disc-shaped elements in said exchange positions.

6. A magnetic arrangement comprising a layer of material in which a pattern of single wall domains representative of data can be moved, a periodic pattern of elements for defining a first and a plurality of second channels in which domains move in response to a magnetic field reorienting cyclically in the plane of said layer, said channels coming into close proximity at exchange positions, an electrical conductor coupled to said layer at said exchange positions, each of said first and second channels including first and second domain positions at each of said exchange positions, said conductor when pulsed being operative to move data at each said first positions in said first and second channels to said second positions in the associated ones of said second and first channels, respectively.

7. A magnetic arrangement in accordance with claim 6 also including means for moving data simultaneously to said first positions.

8. A magnetic arrangement in accordance with claim 6 wherein each of said second channels is a multistage channel, a first stage of each of which is associated with a stage of said first channel at an exchange position, and said conductor is coupled to said layer in a manner to generate a magnetic field at each of said exchange positions for causing data moving from first to consecutive second positions to move instead to second positions in the associated channel in response to said reorienting field.

9. A magnetic arrangement in accordance with claim 8 wherein said pattern of elements comprises permalloy.

10. A magnetic bubble arrangement including a layer of magnetic material in which magnetic bubbles representative of data can be moved along first and second multistage channels which come into close proximity and an exchange position therebetween, said arrangement also including signal responsive means coupled to said layer at said exchange position for swapping data simultaneously between said first and second channels.

11. An arrangement in accordance with claim 10 wherein said first and second channels and said exchange position are defined by a pattern of permalloy elements responsive to a magnetic field reorienting in the plane of said layer for moving data in respective ones of said channels into consecutive first and second positions therein.

12. An arrangement in accordance with claim 11 wherein said signal responsive means includes a conductor coupled to said layer at said exchange position for causing data in said first positions in said first and second channels to move to second positions in said second and first channels respectively when pulsed.

13. An arrangement in accordance with claim 12 wherein said second channel is defined as a recirculating loop including a first stage in close proximity with an associated first stage of said first channel.

14. An arrangement in accordance with claim 12 including a plurality of said second channels each including a first stage in close proximity with an associated different stage of said first channel and including exchange positions between said first stages and associated stages of said first channel.

15. An arrangement in accordance with claim 14 wherein said conductor couples said layer serially at each of said exchange positions.

16. An arrangement in accordance with claim 15 wherein each of said second channels includes a second stage and said arrangement includes a multistage third channel having different stages associated with ones of said second stages wherein said third channel is defined by permalloy elements.

17. An arrangement in accordance with claim 16 wherein said permalloy elements define read exchange positions between said second stages and associated stages of said third channel.

18. An arrangement in accordance with claim 17 also including an electrical conductor coupled to said read exchange positions for producing in said third channel an image of data stored in said second stages.

* * * * *